United States Patent [19]

Albertine et al.

[11] 4,084,250
[45] Apr. 11, 1978

[54] MODULAR ASSEMBLY FOR AN ELECTRONIC COMPUTER

[75] Inventors: Robert J. Albertine, Marlboro; John W. Blomstedt, Bedford; John E. Edfors, Townsend; Victor L. Quattrini, Westford; Paul S. Yoshida, Newton, all of Mass.

[73] Assignee: Honeywell Information Systems Inc., Waltham, Mass.

[21] Appl. No.: 727,063

[22] Filed: Sep. 27, 1976

[51] Int. Cl.² .................... H05K 5/00; H05K 7/10; H05K 7/20
[52] U.S. Cl. .................................... 364/708; 361/384
[58] Field of Search ............... 235/152, 156; 361/383, 361/384, 390, 391, 395, 399; 29/625

[56] References Cited

U.S. PATENT DOCUMENTS

| | | | |
|---|---|---|---|
| 3,903,404 | 9/1975 | Beall et al. | 235/152 |
| 3,904,933 | 9/1975 | Davis | 174/15 R |
| 3,925,710 | 12/1975 | Ebert | 361/383 |
| 3,956,673 | 5/1976 | Seid | 361/383 |
| 4,002,892 | 1/1977 | Zielinski | 235/156 |

*Primary Examiner*—David H. Malzahn
*Attorney, Agent, or Firm*—R. T. Reiling; Nicholas Prasinos; William F. White

[57] ABSTRACT

An electronic computer includes a plurality of printed circuit boards that are slideably mounted in spaced parallel planes within a housing. The housing contains an input/output bus arrangement which is substantially open in the middle. A power supply is detachably mounted to the housing in such a manner as to automatically connect to the input/output bus arrangement when it is secured in place. The power supply includes suction fans which draw ambient air in through the front of the housing over the printed circuit boards, through the open portion of the bus arrangement and hence over critical portions of the power supply. The air is initially drawn through perforated openings in a hinged control panel in one preferred embodiment. In another preferred embodiment, the air is drawn through a stationary member at the front of the housing.

35 Claims, 9 Drawing Figures

MODULAR ASSEMBLY FOR AN ELECTRONIC COMPUTER

BACKGROUND OF THE INVENTION

1. Field of the Invention

This invention relates generally to the assembly of various electronic modules into a completed electronic device. In particular, this invention relates to the formation of an electronic computer from a series of individual electronic elements.

2. Description of the Prior Art

Today's electronic computer must be a compact, space-saving device which can easily fit into any number of different environmental constraints. This same computer must be readily serviceable in terms of accessibility to its various internal electronics. It is to be appreciated that the first requirement as to compactness is often in direct contrast with the second requirement as to ease of access and serviceability.

The above conflicting requirements have heretofore been met by various arrangements of electronic elements within a computer enclosure. These arrangements have often emphasized compactness over ease of access and serviceability. These arrangements have moreover led to crowded electronics with complicated interconnections that are not easily disconnected. The crowded electronics within a limited space furthermore introduce difficulties as to cooling.

OBJECTS OF THE INVENTION

It is an object of this invention to provide an electronic computer with a compact arrangement of electrical elements.

It is another object of this invention to provide an electronic computer with a plurality of elements that are easily disconnected from each other.

It is still another object of this invention to provide an arrangement of elements within an electronic computer that allows for easy access to individual elements.

It is a still further object of this invention to provide an arrangement of elements within an electronic computer which provides for an efficient cooling of the electronics.

SUMMARY OF THE INVENTION

The above objects are achieved according to the present invention by providing an arrangement of electronic elements within an electronic computer that occupy a relatively small amount of space and effectively utilize the same so as to constitute a self-contained computer unit. In a preferred embodiment, the electronic elements are mounted within a tray or housing which slides into an overall enclosure. Electrical cabling situated along the sides of the enclosure make convenient connections to the various electronic elements within the housing. The electronic elements comprise in part a number of relatively small printed circuit boards that are mounted in piggy-back fashion to larger printed circuit boards. The larger printed circuit boards are slideably mounted within the aforementioned housing. The major printed circuit boards slideably engage an input/output bus arrangement that receives power from a detachably mounted power supply. A control panel is hinged at the front of the enclosure and is electrically connected via flexible cables to the printed circuit boards.

The arrangement of electronic elements is cooled by suction fans located at the rear of the computer unit. The suction fans draw air through perforations within the control panel. Air flows throughout the layers of printed circuit boards and hence through the power supply located at the rear of the computer unit. The air circulation is enhanced by a bus structure which does not appreciably obstruct the air flow from front to rear of the computer.

BRIEF DESCRIPTION OF THE DRAWINGS

For a better understanding of the present invention, reference should be made to the accompanying drawings wherein.

DESCRIPTION OF THE PREFERRED EMBODIMENT

Figure 1:
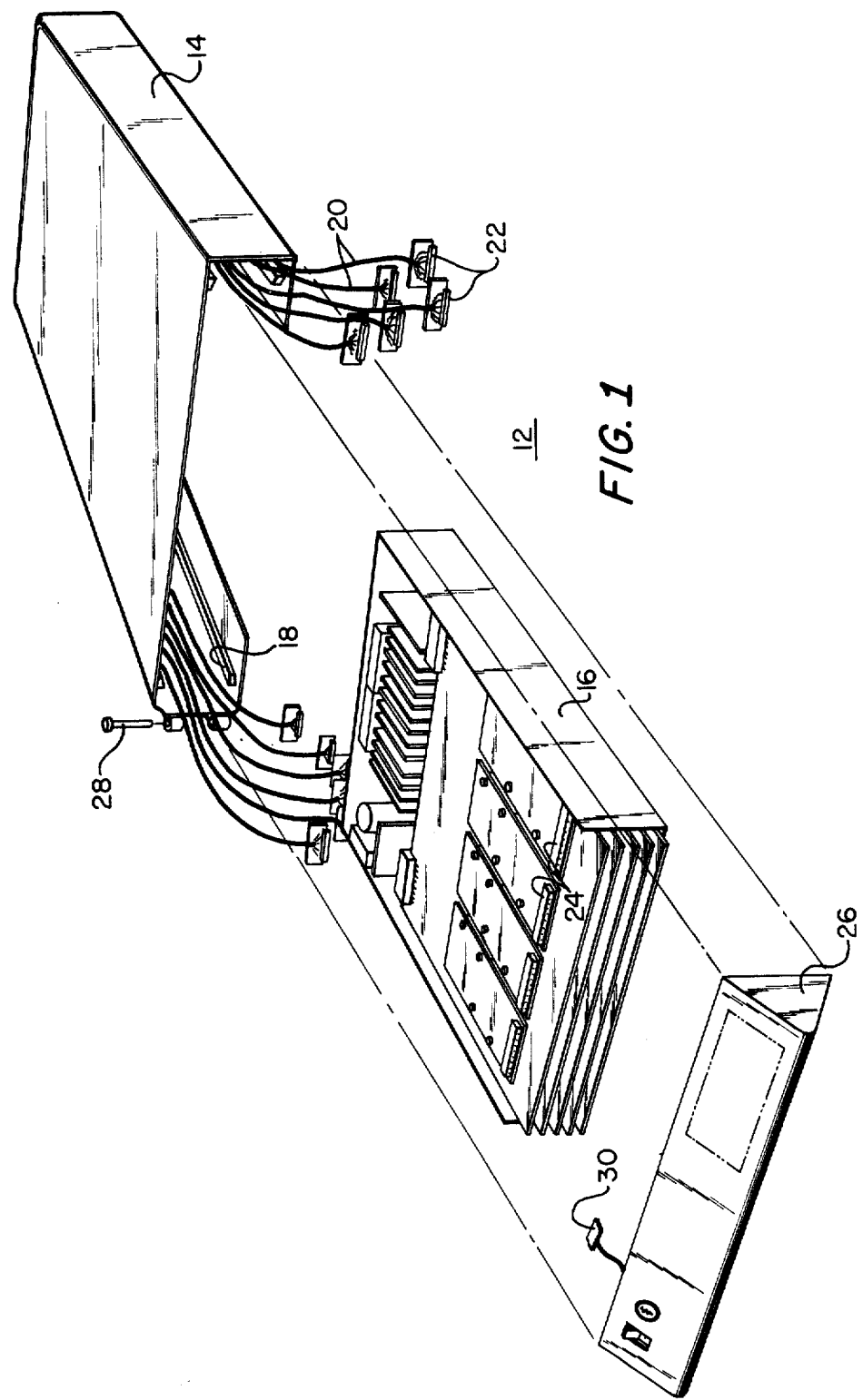
FIG. 1 illustrates the overall arrangement of electronic elements which constitute the computer unit.

Referring to FIG. 1, a computer unit 12 is seen to comprise an enclosure 14 which receives an arrangement of electronic elements situated on a tray or housing 16. The housing 16 slideably engages runners such as 18 extending along the sides of the enclosure 14. A plurality of cable assemblies 20 are mounted along the sides of the enclosure 14 so as to not interfere with the slideable engagement of the housing 16 with the runners 18. The cable assemblies 20 are preferably fixedly mounted to the sides of the enclosure 14 so as to remain stationary relative thereto. The cable assemblies 20 each contain printed circuit terminals 22 which plug into electrical receptacles 24 within the housing 16. These latter connections are made once the housing 16 has moved into the enclosure 14.

A control panel 26 is hinged to the enclosure 14 through a pin 28. The control panel 26 pivots about the pin 28 so as to allow access to the arrangement of electronic elements within the enclosure 14. The control panel 26 electrically connects to an electrical receptacle such as 24 within the enclosure 14 via a terminal 30. The terminal 30 is easily disconnected from its electrical receptacle in a manner which will be explained in detail hereinafter.

Figure 2:
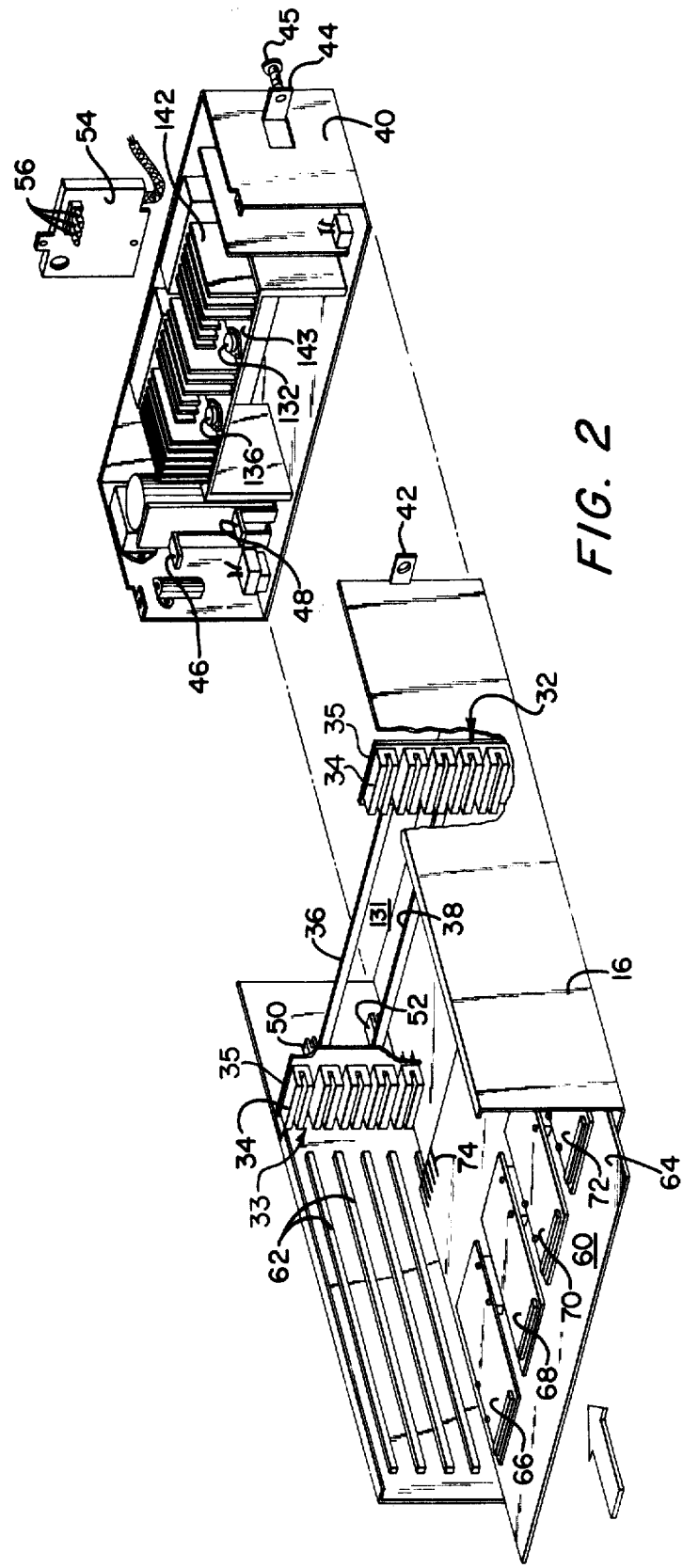
FIG. 2 is an exploded view of the electronic elements within the housing portion of the computer unit of FIG. 1.

Referring now to FIG. 2, the electronic elements within the housing 16 are illustrated in a partially-exploded view. The partially-exploded view clearly shows a pair of separate and distinct vertical busses 32 and 33 which are contiguous with the sides of the housing 16.

The vertical busses are moreover located at the same inward distance from the front of the enclosure 14 so as to extend outwardly from corresponding inwardly located contiguous points along the sides of the housing 16. Each vertical bus extends outwardly from its side of the housing 16 for a distance of not more than twenty percent of the internal width or distance between the sides of the housing. This establishes a substantially unobstructed space between the vertical busses which will be discussed in detail hereinafter.

Each vertical bus consists of a number of separate pin connectors 34 that are inserted into holes within a printed circuit board 35. The pin connectors comprise a plurality of electrical contacts within the U-shaped receiving portion of the connector. These contacts are electrically connected to the pins extending from the rear of the connector. The printed circuit board 35 receives the pins from the connectors 34 and makes various interconnections via a printed circuit. Electrical pin connectors which may be generally used for this purpose are fully disclosed in U.S. Pat. No. 3,609,463 to B. A. Laboue.

The vertical busses 32 and 33 are interconnected by a horizontal ground bus 36 and a horizontal DC voltage bus 38. The horizontal busses 36 and 38 are spaced from each other in such a manner as to retain much of the open nature of the area between the vertical busses 32 and 33. The DC voltage appearing across the horizontal busses 36 and 38 is generated by a power supply 40. The power supply 40 slideably engages the rear portion of the housing 16 along the sides and bottom thereof. This slideable engagement is limited by a pair of flanges such as 42 to either side of the housing 16 which meet with flanges such as 44 extending from either side of the power supply 40. The power supply 40 is secured to the housing 16 by threaded screws 45 which thread through the extended flanges 42 and 44.

The power supply 40 automatically connects to the horizontal busses 36 and 38 when it has been secured to the housing 16. In this regard, a pair of electrical contacts 46 and 48 in the form of stiff cantilevered projections extend outwardly from their locations within the power supply 40. The outwardly extending portions of the electrical contacts 46 and 48 are received by spring-loaded clips 50 and 52 located respectively on the horizontal ground bus 36 and the horizontal DC voltage bus 38. In this manner, the ground bus 36 receives a ground voltage level from the electrical contact 46 via the spring-loaded clip 50. The DC voltage bus 38 receives a DC voltage from the electrical contact 48 via the spring-loaded clip 52. The voltage levels on the horizontal busses 36 and 38 are in turn applied to the printed circuits of the vertical busses 32 and 33. As has been previously noted, these printed circuits interconnect various pins of the pin connectors in each vertical bus.

The power supply 40 receives an external AC voltage via a detachable AC input assembly 54. The detachable AC input assembly 54 includes a series of prongs 56 which mate with a receptacle located on the backside of the power supply 40.

Turning now to the front portion of the housing 16, it is seen that a printed circuit board assembly 60 slideably engages runners such as 62 located along the sides of the housing. The runners 62 are preferably spaced along each side of the housing 16 so as to accommodate five separate printed circuit board assemblies. Each printed circuit board assembly 60 comprises a mother board 64 and one or more daughter boards 66 through 72. This piggy-back arrangement of one or more daughter boards to a mother board will be discussed in detail hereinafter.

The mother board of each printed circuit board assembly contains an electrical contact region 74 located at both corners of its leading edge. These electrical contact regions engage the receiving portion of an electrical pin connector within either the vertical bus assembly 32 or the vertical bus assembly 33. As has been previously discussed, the pin connectors are mounted on printed circuit interconnection boards. Each printed circuit interconnection board conducts electrical signals and electrical power among the printed circuit board assemblies such as 60 which are connected through electrical contact regions such as 74 to respective pin connectors.

Figure 3:
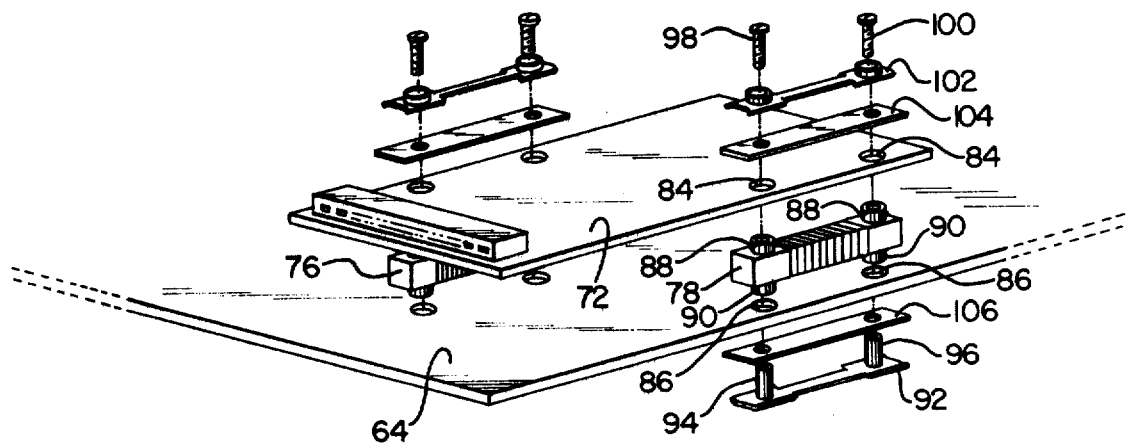
FIG. 3 illustrates in further detail the piggy-back interconnection of printed circuit boards in FIG. 2.

Referring now to FIG. 3, the piggy-back relationship of the daughter board 72 to the mother board 64 is illustrated in detail. The daughter board 72 is seen to be separated from the mother board 64 by a pair of electrical connectors 76 and 78. Each of the electrical connectors interconnects points on the top surface of the mother board 64 with points on the bottom surface of the daughter board 72. These points on the mother and daughter boards are located relative to holes 84 and 86 which receive circular collars 88 and 90 of the electrical connector 78. The collars 88 and 90 fit snugly into the holes 84 and 86 so as to align the electrical connector with respect to the various contact points on the mother and daughter boards. The electrical connector 78 is secured to the mother and daughter boards by a top and bottom clasp arrangement as shown. The bottom clasp 92 contains protrusions 94 and 96 which extend upwardly into hollow interior holes within the collars 90. The protrusions 94 and 96 threadably engage a pair of screws 98 and 100. The pair of screws 98 and 100 insert through an upper clasp 102 which bears down upon an insulated member 104 that is flush with the mother board 64 when the screws are tightened. The bottom clasp 92 similarly bears upon an insulative member 106 which is in contact with the mother board 64. The electrical connector 78 is illustrated in its secured relationship with the mother board 64 and daughter board 72 in FIG. 4. Note that the screw 98 is threadably engaged with the protrusion 94 of the bottom clasp 92.

Figure 5:
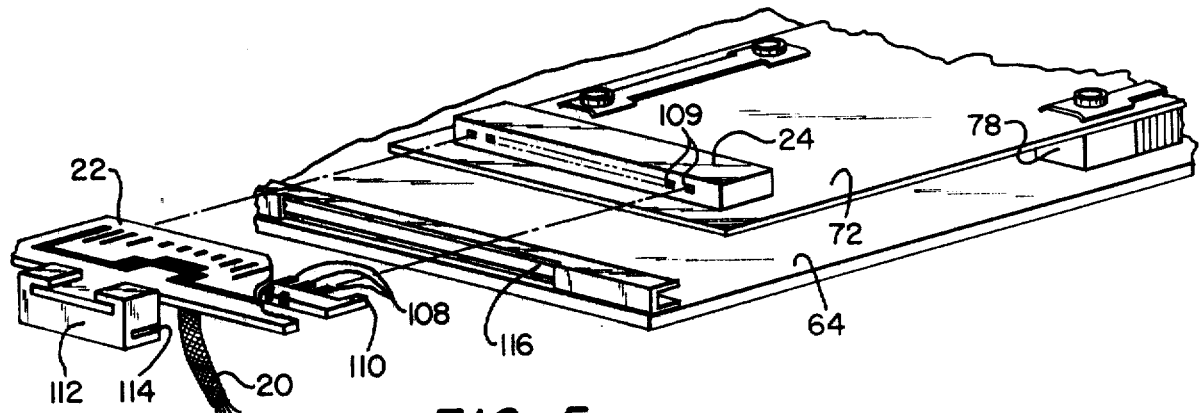
FIG. 5 illustrates the interconnection of the piggy-back printed circuit boards of FIG. 3 with a terminal portion of an electrical cable.

Referring now to FIG. 5, the daughter board 72 is illustrated in its secured relationship with respect to the mother board 64. The daughter board 72 is also depicted relative to a printed circuit terminal 22 of a cable assembly 20. An electrical receptacle 24 on the daughter board 72 receives electrical pins 108 extending from underneath the printed circuit terminal 22. The printed circuit on the terminal 22 is electrically connected to the series of pins which extend from a mount thereunder. The pins 108 insert into holes 109 within the electrical receptacle 24. The pins 108 are aligned with respect to the holes by virtue of guides such as 110 which contact either side of the electrical receptacle 24. The holes 109 are electrically connected to the circuitry on the daughter board 72.

The printed circuit terminal 22 furthermore contains a rigid clip 112 which attaches to the rear thereof and extends thereunder. The clip 112 contains a spring-loaded slot 114 which engages a raised lip 116 that is attached to the edge of the mother board 64. The raised lip 116 is preferably a stiff rigid metal bar capable of supporting the printed circuit terminal 22 as well as the electrical cable 20 which extends therefrom. The daughter board 74 is located inwardly from the edge of the mother board 64 so as to allow the pins 108 to insert into the holes 109 of the electrical receptacle 24 when the slot 114 engages the raised lip 116. The position of the daughter board 72 is governed by where the electrical connectors 76 and 78 are attached to the mother board 64. In this regard, the holes on the mother board 64 which receive the collars of the electrical connector are such as to appropriately locate the electrical receptacle 24 relative to the printed circuit terminal 22, when the latter is attached to the raised lip 116. In this manner, the pins 108 of the printed circuit terminal are merely inserted into the holes 109 of the electrical receptacle 24 without having to carry the weight of the printed circuit terminal 22 or the cable 20. In other words, the printed circuit terminal is primarily supported by the rigid clip 112 attached to the raised lip 116.

It is to be noted that each of the cables 20 preferably connects to a particular device external to the computer unit 12. In this regard, each cable represents a communications link to a specific device. Each of these cable assemblies are in turn electrically connected to an electrical receptacle on a given daughter board. The circuitry on the daughter board is specific to the device which is connected thereto and serves as an interface with more generalized data processing circuitry on the mother board. In other words, the circuitry on a given mother board is of a general data processing nature whereas the circuitry on a daughter board is specific to an external device.

Figure 4:
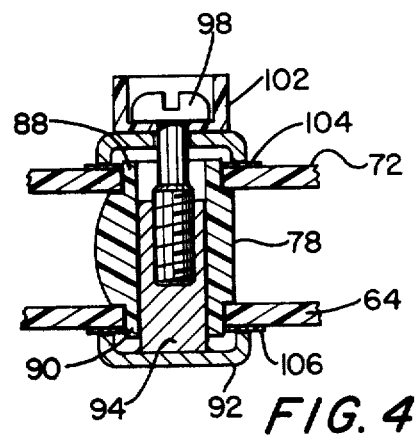
FIG. 4 is a cross-sectional view of the electrical connector used to make the piggy-back interconnection of printed circuit boards in FIG. 3.
Figure 6:
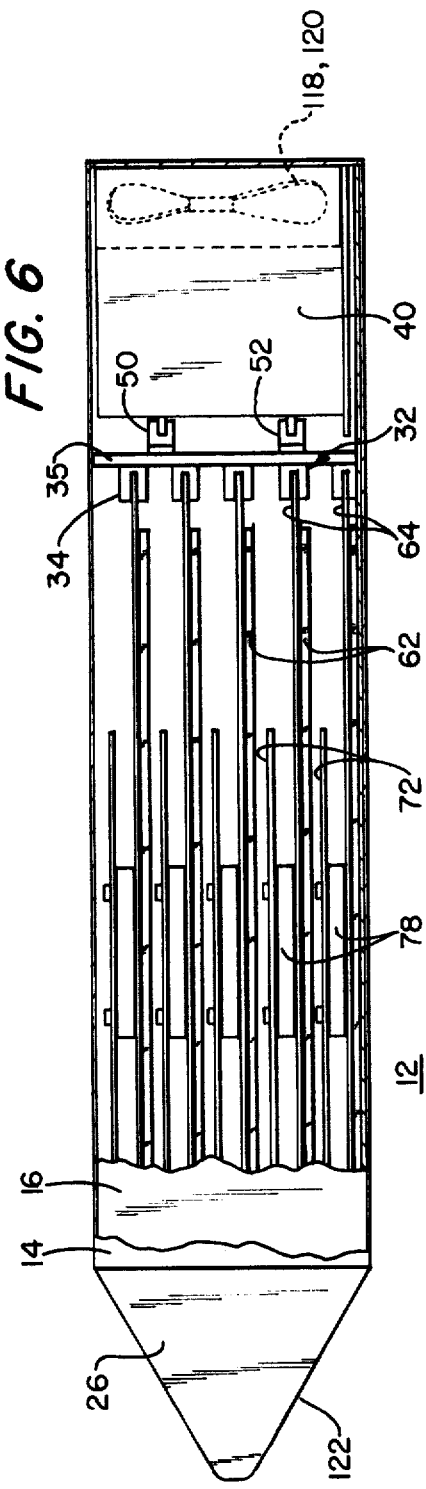
FIG. 6 is a partially-sectioned side profile of the computer unit of FIG. 1.

It is to be appreciated that a specified height is established between a daughter board and its mother board by virtue of the arrangement of FIGS. 3 through 5. This specified height is dictated by a uniform vertical height of each electrical connector between the bottom surface of the daughter board and the top surface of the mother board. Referring to FIG. 6, this uniform vertical height is such as to vertically position a daughter board 72 midway between two successive mother boards 64. The mother boards 64 are spaced relative to each other by the runners 62 which support them. The runners 62 are equally spaced along the sides of the housing 16 at twice the uniform height of an electrical connector plus the thickness of a daughter board. This places the daughter boards midway between successive mother boards.

FIG. 6 furthermore depicts the overall side profile of the computer unit 12 consisting of the control panel 26, the enclosure 14 which is cut away to the housing 16 which is subsequently cut away to the arrangement of printed circuit boards therein. This spaced arrangement of printed circuit boards has been previously discussed. It is also to be noted that the cut-away from the housing 16 illustrates the engagement of the mother boards with the electrical pin connectors 34 of the vertical bus assembly 32. Located further to the rear of the cut-away housing is the power supply 40. The power supply 40 houses a pair of suction fans 118 and 120 which are located at the extreme rear of the computer unit 12. These fans draw air through the control panel 26, through the arrangement of printed circuit boards and subsequently back through the power supply 40. The airflow is uniformly distributed over both the mother board and daughter boards by virtue of their equidistant vertical spacing.

Figure 7:
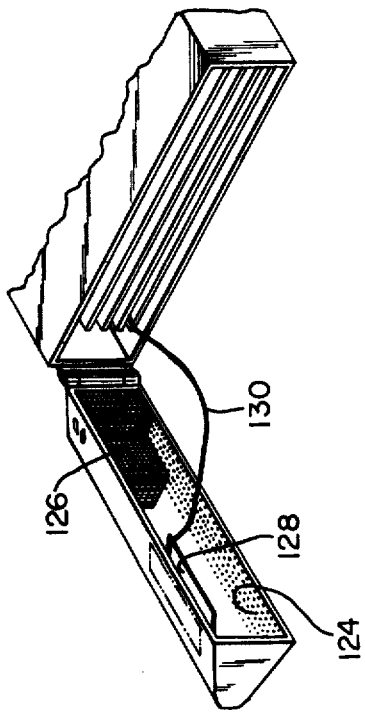
FIG. 7 illustrates the interior of the hinged control panel of the computer unit of FIG. 1.

The air is initially drawn through the bottom half of a downwardly slanting portion 122 of the control panel 26. This bottom half of the downwardly slanting portion 122 is uniformly perforated with small openings. Referring to FIG. 7, the control panel is illustrated in an open position relative to the enclosure 14. The perforated openings 124 in the lower half of the slanting portion 122 are clearly shown. These openings must not constrict or impede the suction action of the fans 118 and 120. In the preferred embodiment, these openings are circular holes of 3/16 inch diameter. These openings constitute in the aggregate an open surface area equal to 33 percent of the total surface area of the bottom half of the downwardly slanting portion 122. This percentage of open surface area translates to an open surface area of thirty square inches for the disclosed computer configuration having a vertical height of 6.38 inches, a width of 19.88 inches and a length from the front extreme of the control panel 26 to the extreme rear of the computer unit 12 of 30.69 inches.

It is to be noted that the lower part of the control panel is essentially free of any obstructions to airflow. The extreme left side of the control panel contains a housing 126 which is perforated for uninhibited airflow therethrough. The upper portion of the control panel houses various electronics such as a printed circuit board 128. The printed circuit board 128 interfaces various electronic control functions on the control panel with at least one printed circuit board within the enclosure 14. This is facilitated by a cable 130 having a terminal 30 which is illustrated in FIG. 1. The printed circuit terminal 30 plugs into an electrical receptacle 24 within the housing 16. This connection is easily disconnected for further access to particular printed circuit board assemblies.

Figure 8:
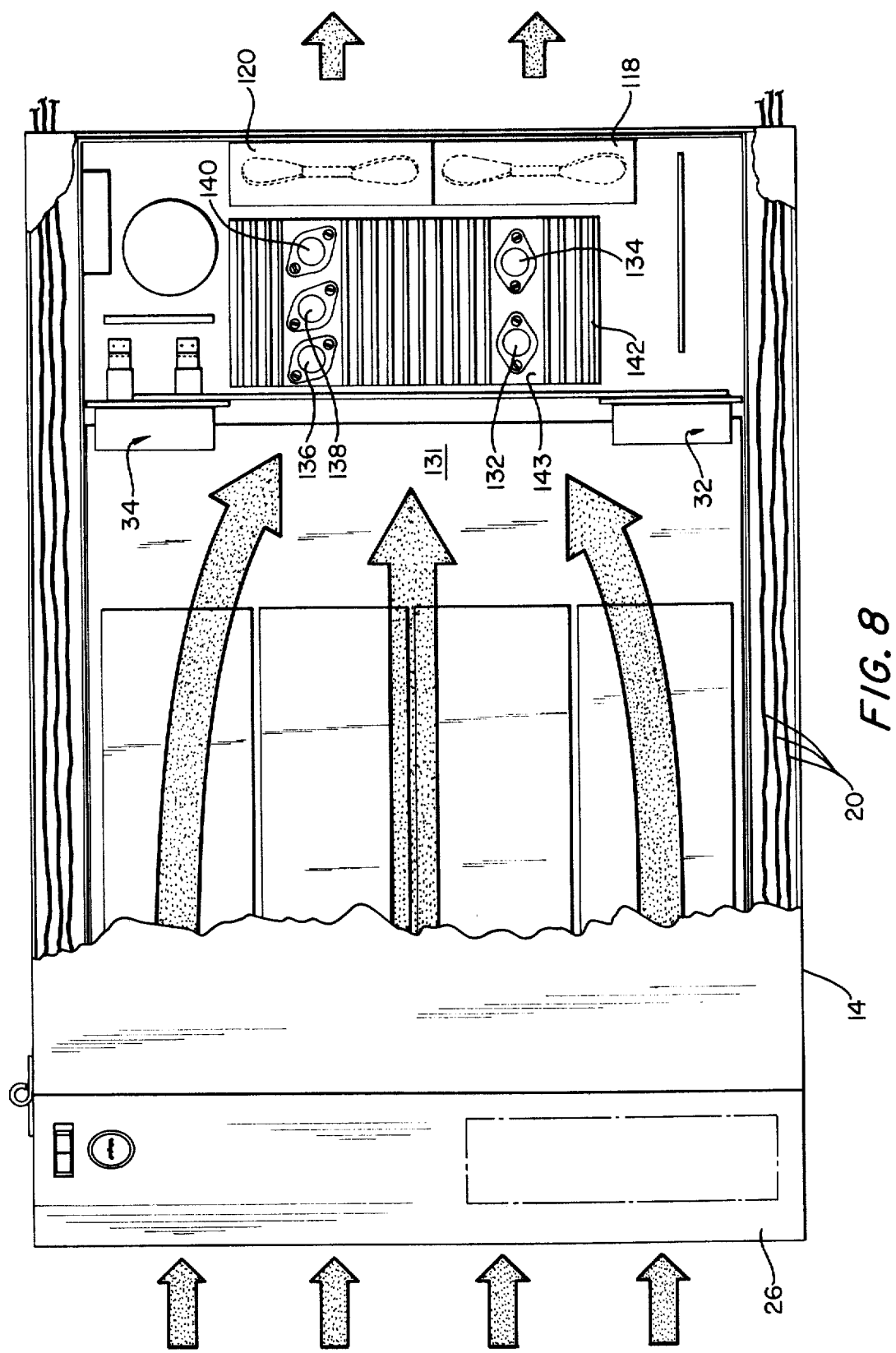
FIG. 8 is a partially-sectioned top view of the computer unit of FIG. 1.

The airflow is further illustrated in FIG. 8 which depicts ambient air being drawn into the control panel 26. The air subsequently flows over the printed circuit boards and hence between the vertical busses 32 and 33. In this regard, the directional flow is not appreciably obstructed by the limited widths of the vertical busses. This relatively unrestricted airflow in the axial direction allows for the proper cooling of the printed circuit boards.

Referring to FIG. 2, it is to be noted that the vertical and horizontal busses present essentially an open unobstructed space 131 in the middle of the computer unit so as to facilitate airflow through to the power supply 40. This open unobstructed space is principally defined by the vertical busses 32 and 33. These busses have preferably identical widths that are each less than or equal to twenty percent of the internal width of the housing 16. Such width-wise limitations on the vertical busses 32 and 33 combine to define a 60 percent open cross-sectional area within the enclosure 14. It has been found by experimentation that this unobstructed open space can be furthermore reduced by partial width-wise obstructions such as the horizontal busses 36 and 38. This reduction of open space must not exceed 60 percent. In other words, the net amount of actual open space forward of the power supply 40 must not be less than 36 percent of the interior cross-sectional area defined by the interior sides and bottom of the housing 16 and the interior sides and top of the enclosure 14. It is to be noted that the horizontal busses do not totally cause this further 60 percent reduction to the space between the vertical busses 32 and 33. Obstructions are also caused by the mother boards immediate to this space. Furthermore, an obstructive contribution caused by a radio frequency interference screen (not shown) between the vertical busses must also be taken into consideration. In any event, the combined total of all such partial obstructions must not reduce the area 131 between the vertical busses 32 and 33 by more than 60 percent. This results in a net open area of 36 percent of the interior cross-sectional area proscribed by the housing 16 and enclosure 14.

Referring again to FIG. 8, the airflow through the space 131 between the vertical busses 32 and 33 is seen to be fully utilized by the power supply 40 which is located immediately in back of the busses. In this regard, the middle portion of the power supply, which is located directly in back of the essentially unobstructed space 131 between the vertical busses, consists of a number of power transistors 132 through 140. The power transistors are surrounded by cooling fins such as 142 which rise up from a metal base 143 upon which the power transistors are mounted. The cooling fins conductively cool the metal base 143 and are in turn convectively cooled by the airflow caused by the suction fans 118 and 120. The cooling fins 142 and the metal base 143 are further illustrated in FIG. 2.

It is to be noted that the fans 118 and 120 are located to the extreme rear of the computer unit 12. This allows access to all of the electronic elements forward of the power supply when the control panel 26 is pivoted about pin 28. This accessability feature dictates that the fans must be capable of drawing sufficient air through the control panel which is located a considerable distance away. In the preferred embodiment, the fans collectively provide an airflow of 100 cubic feet per minute which creates a pressure differential of at least 0.18 inches of water between the front and back of the computer unit. This pressure differential is adequate to insure a continuous airflow over the printed circuit board assemblies as well as the power supply.

It is to be noted that the pressure differential drops to 0.08 inches of water when only one of the fans is functioning so as to produce an airflow of 50 cubic feet per minute. This latter condition is considered to be a temporary possibility and is allotted for by providing individual wiring to the fan units 118 and 120 thereby allowing them to operate separately. It is finally to be noted that the fans 118 and 120 are located to either side of the central axis of the computer unit 12. This central location places the area 131 entirely within the suction of the fans.

Figure 9:
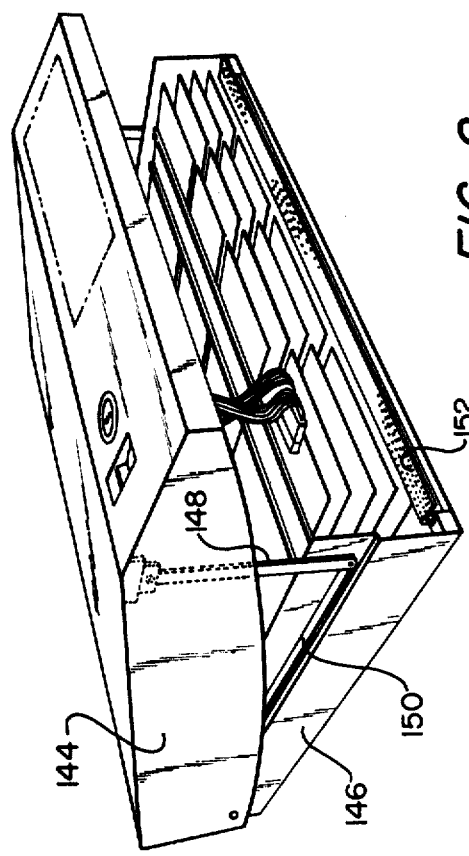
FIG. 9 illustrates an alternate computer unit to that of FIG. 1.

FIG. 9 illustrates an alternative to the computer unit 12 with its hinged control panel 26. Specifically, a unitary top 144 is pivotally attached to the rear of a bottom housing or enclosure 146. The unitary top 144 is raised to an upright position and held in place by a pair of hinged stay arms 148. The lower end of these stay arms travel in slots such as 150 which accommodate the stay arm in a forward upright position or in a reclined position. It is to be understood that the reclined position of the stay arms 148 allows the unitary top 144 to close down onto the bottom enclosure 146. A perforated lip 152 detachably mounted to the bottom enclosure 146 allows for the intake of an appropriate volume of air therethrough for cooling purposes. The perforated lip 152 is uniformly perforated in the same manner as the perforated area of the hinged control panel 26. The cooling fans which are located to the rear of the computer unit thereby draw the air through the perforated lip 152 so as to cool the electronics within the bottom enclosure 146 in much the same manner as has been previously disclosed with respect to the computer unit 12 of FIGS. 1 through 8.

From the foregoing, it is to be appreciated that two preferred embodiments have been disclosed of a modular computer unit capable of being readily accessed from the front thereof. The modularity includes the ability to separately access individual electronic elements. The modular computer unit moreover provides for an axial cooling of the electronic elements by drawing ambient air through the front portion thereof. It is to be noted that these modular electronic elements may have equivalents which could be substituted therefor without departing from the scope of the present invention.

What is claimed is:

1. Apparatus for electronically processing information, said apparatus comprising:
    a plurality of means for receiving the information;
    a plurality of means for processing the received information, said plurality of means for processing located in equally spaced planes;
    means for detachably connecting said plurality of means for receiving the information with said plurality of means for processing the received information;
    means for interfacing said plurality of means for processing the received information, said interfacing means comprising separate and distinct bus structures which are separated by a substantially open space therebetween;
    means for supplying electrical power to said interfacing means; and
    means for detachably connecting said power supply means to said interfacing means.

2. The apparatus of claim 1 wherein said apparatus further comprises:
    a housing having a pair of sides and a bottom, said sides containing equally spaced mountings which slideably engage said plurality of processing means so as to mount said plurality of processing means in equally spaced parallel planes.

3. The apparatus of claim 2 wherein said housing furthermore contains said interfacing means located to the rear of said plurality of equally spaced processing means occurring in equally spaced parallel planes, and wherein said separate and distinct bus structures are each contiguous with a side of said housing and extend outwardly therefrom for distances of not more than one-fifth of the internal width from side to side of said housing.

4. The apparatus of claim 3 wherein said separate and distinct bus structures each comprise:
    a plurality of multiple contact electrical connectors mounted on an interconnecting circuit board, said interconnecting circuit board providing various connections between the multiple contacts of the electrical connectors, the multiple contact of each of said electrical connectors being furthermore detachably connected to one of plurality of means for processing the received information.

5. The apparatus of claim 3 wherein said power supply means detachably mounts to said housing and said means for detachably connecting said power supply means to said interfacing means comprises:
    a pair of stiff cantilevered contacts which extend outwardly from said power supply means; and
    a pair of means, extending outwardly from said interfacing means towards said pair of stiff cantilevered contacts, for slideably receiving said pair of stiff cantilevered electrical contacts when said power supply means is mounted to said housing.

6. The apparatus of claim 5 further comprising an open-ended enclosure wherein said housing is slideably mounted, said housing containing said plurality of processing means, said interfacing means, and said power supply means.

7. The apparatus of claim 6 wherein said plurality of means for receiving the information are affixed to the sides of said open-ended enclosure.

8. The apparatus of claim 7 wherein said plurality of means for detachably connecting said plurality of means for receiving information to said plurality of means for processing the received information each comprises:
   a plural electrical receptacle, electrically connected to one of said means for processing the received information; and
   a terminal mounted on one of said means for receiving information; said terminal comprising a plurality of electrical contacts which extend outwardly from said terminal so as to be received by said plural electrical receptacle.

9. The apparatus of claim 8 wherein each of said terminals mounted on a means for receiving information further comprises:
   means, detachably mounted to said means for processing the received information, for supporting said terminal when the plurality of electrical contacts are received by said plural electrical receptacle.

10. The apparatus of claim 6 wherein said power supply further comprises:
    means, located at the rear of said power supply, for drawing ambient air in through the front of said open-ended enclosure, over said means for processing information, through said substantially unobstructed opening between the separate and distinct bus structures and hence over said power supply.

11. The apparatus of claim 10 wherein said power supply comprises:
    a metal base platform located forward of said means for drawing ambient air and aft of said substantially open space between said bus structures;
    a plurality of heat conductive cooling fins extending upwardly from said metal base platform; and
    a plurality of power transistors located on said metal base platform in corridors between said cooling fins whereby said plurality of power transistors and said heat conductive cooling fins are convectively cooled by the drawn ambient air.

12. The apparatus of claim 11 wherein said means for drawing ambient air comprises:
    a pair of independently powered suction fans, mounted adjacent to one another so as to have a combined width equal to the width of the substantially unobstructed opening between said bus structures.

13. The apparatus of claim 12 further comprising a control panel hinged to one side of said open-ended enclosure so as to swing open thereby allowing immediate access to said plurality of means for receiving the information, said plurality of means for processing the received information and said means for detachably connecting said receiving means to said processing means.

14. The electronic computer of claim 13 wherein said hinged control panel comprises:
    a top inclined surface containing various electronic functions which are activated by the computer operator;
    a bottom inclined surface, said bottom inclined surface having an area which is uniformly perforated with small openings so as to allow ambient air to be drawn therethrough by said drawing means.

15. The electronic computer of claim 14 wherein said area of uniformly perforated small openings comprises at least one-half of the bottom inclined surface.

16. The apparatus of claim 15 wherein said plurality of means for detachably connecting said plurality of means for receiving information to said plurality of means for processing the received information each comprises:
    a plural electrical receptacle, electrically connected to one of said means for processing the received information; and
    a terminal mounted on one of said means for receiving information; said terminal comprising a plurality of electrical contacts which extend outwardly from said terminal so as to be received by said plural electrical receptacle.

17. The apparatus of claim 16 wherein each of said terminals mounted on a means for receiving information further comprises:
    means, detachably mounted to said means for processing the received information, for supporting said terminal when the plurality of electrical contacts are received by said plural electrical receptacle.

18. The apparatus of claim 2 wherein said power supply comprises:
    means, located at the rear of said power supply for drawing ambient air over said means for processing information, through said substantially unobstructed opening between the separate and distinct bus structures and hence over said power supply.

19. The apparatus of claim 18 wherein said power supply comprises:
    a metal base platform located forward of said means for drawing ambient air and aft of said substantially open space between said bus structures;
    a plurality of heat conductive cooling fins extending upwardly from said metal base platform; and
    a plurality of power transistors located on said metal base platform in corridors between said cooling fins whereby said plurality of power transistors and said heat conductive cooling fins are convectively cooled by the drawn ambient air.

20. The apparatus of claim 19 further comprising:
    means, containing perforated openings, for allowing ambient air, external to said apparatus for processing information, to pass through the perforated openings, said means being located in front of said plurality of means for processing information.

21. The apparatus of claim 20 wherein said means containing perforated openings is uniformly perforated with small openings which comprise a net aggregate open area equal to at least thirty-three percent of the total area of uniformly perforated small openings.

22. The apparatus of claim 20 wherein said means containing perforated openings is detachably mounted to the front of said housing.

23. The apparatus of claim 22 further comprising:
    a top enclosure which is pivotally attached at the rear of said housing, said top enclosure having a front portion which extends downwardly over the front of said housing so as to contact said means containing the perforated openings.

24. An electronic computer having a tray of a plurality of electronic elements that slides into an enclosure, said computer further comprising:
 a front control panel hinged to one side of said enclosure so as to swing completely open thereby allowing access to said tray of said plurality of electronic elements;
 a power supply detachably mounted to the rear of said tray;
 an input/output bus arrangement comprising two separate and distinct busses located forward of said power supply and to either side of the tray, said separate and distinct busses being spaced from each other so as to define a substantially open space therebetween, said substantially open space being centrally located and equidistant from the sides of the tray, said plurality of electronic elements located in equally spaced parallel planes, said plurality of elements being detachably connected to said input/output bus arrangement; and
 cabling, extending along the sides of said enclosure and detachably connected to said plurality of electronic elements.

25. The electronic computer of claim 24 wherein said separate and distinct busses are each contiguous with a side of said tray and extend outwardly therefrom for distances of not more than one-fifth of the internal width from side to side of said tray.

26. The electronic computer of claim 24 wherein said plurality of electronic elements located in equally spaced parallel planes comprises:
 a plurality of first printed circuit boards, each of which slideably engages a runner located along the side of said tray and thereafter engages the input/output bus arrangement; and
 a plurality of second printed circuit boards spaced from said first printed circuit boards and electrically connected thereto by a plurality of electrical connectors.

27. The electronic computer of claim 36 wherein said plurality of second printed circuit boards each include an electrical receptacle for receiving an electrical terminal located on the end of a cable, each of said electrical terminals further comprising:
 means for establishing electrical contact with said electrical receptacle; and
 means detachably mounted to a first printed means for supporting said means for establishing electrical contact.

28. The electronic computer system of claim 27 wherein said electrical contacting means comprises:
 a plurality of electrical contact pins which extend outwardly toward said electrical receptacle; and
 means, spaced from said plurality of pins, for guiding said plurality of pins into electrical contact with said electrical receptacle.

29. The electronic computer of claim 24 wherein said power supply includes:
 a pair of independently powered suction fans located rearwardly of the open space between the two separate and distinct busses.

30. The electronic computer of claim 29 wherein said power supply further comprises:
 a metal base platform located forward of said suction fans and immediately aft of said open space between said separate and distinct busses;
 a plurality of conductive cooling fins extending upwardly from said metal base platform; and
 a plurality of power transistors located on said metal base platform in corridors between said cooling fins.

31. The electronic computer of claim 29 wherein said hinged control panel comprises:
 a top surface containing various electronic functions which are activated by the computer operator;
 a bottom surface inclined relative to the bottom of said enclosure, said bottom surface having an area which is uniformly perforated with small openings so as to allow ambient air to be drawn therethrough by said independently powered suction fans.

32. The electronic computer of claim 31 wherein said area of uniformly perforated small openings comprises at least one-half of the bottom inclined surface.

33. The electronic computer of claim 31 wherein said area of uniformly perforated small openings comprises a net aggregate open area equal to at least thirty-three percent of the total area of uniformly perforated small openings.

34. The electronic computer of claim 33 wherein said bus arrangement further comprises:
 a pair of common voltage level busses extending between said separate and distinct input/output busses, said pair of common voltage level busses each comprising means for receiving a respective voltage level from said power supply.

35. The electronic computer of claim 34 wherein said power supply comprises stiff cantilevered electrical contacts which engage said means for receiving said respective voltage level within said pair of common voltage level busses when said power supply is mounted and attached to the rear of said tray.

* * * * *